United States Patent [19]

Arimoto et al.

[11] Patent Number: 4,602,224
[45] Date of Patent: Jul. 22, 1986

[54] VARIABLE CAPACITANCE REACTANCE CIRCUIT

[75] Inventors: Sohei Arimoto, Yokohama; Hitoshi Miyashita, Kawaguchi, both of Japan

[73] Assignee: Nippon Motorola Ltd., Japan

[21] Appl. No.: 684,329

[22] Filed: Dec. 20, 1984

[51] Int. Cl.⁴ .................. H03B 5/32; H03C 3/20; H03H 11/00

[52] U.S. Cl. .................. 332/16 T; 331/158; 331/177 R; 332/30 R; 333/214

[58] Field of Search ............... 332/16 T, 29 R, 30 R; 333/214, 215; 331/36 C, 177 R, 177 V, 158; 328/127, 142

[56] References Cited

U.S. PATENT DOCUMENTS 3,553,609  1/1971  Edge ....................... 333/214
3,911,296 10/1975  Davis ...................... 307/297
3,986,145 10/1976  Hongu et al. ............. 332/16 T Primary Examiner—Siegfried H. Grimm
Attorney, Agent, or Firm—Michael D. Bingham

[57] ABSTRACT

A circuit having an effective output capacitance the value of which can be varied over a predetermined range of values includes first and second differential amplifiers. The differential inputs of the second differential amplifier are connected to the differential outputs of the first differential amplifier, the latter of which receives a variable control signal. The second differential amplifier includes a pair of transistors the emitters of which are AC coupled to ground. A capacitor is coupled between the base and collector of one of the pair of transistors, the collector of which is coupled to the output of the circuit. A diode is AC coupled between the base and ground of the one transistor whereby the impedance thereof is varied in direct relationship to the conduction of the one transistor in response to the control signal thereby causing the value of the output capacitance of the circuit to be varied.

12 Claims, 2 Drawing Figures

VARIABLE CAPACITANCE REACTANCE CIRCUIT

BACKGROUND OF THE INVENTION

The present invention relates to capacitance multiplier circuits and, more particularly, to circuits in which the output capacitance has a variable capacitive reactance value that can be electronically varied over a predetermined range of values.

Capacitance multiplier circuits are well known in the art. For example, U.S. Pat. No. 3,911,296 discloses an integrated circuit which has an effective capacitance that is equal to the capacitance of a capacitor multiplied by a factor of beta, where beta is the common emitter current gain of an NPN transistor formed in an integrated circuit including the capacitor. The capacitor is coupled between the collector and base of the transistor. If an alternating current (AC) is introduced at the collector of the transistor a proportion thereof flows into the capacitor and into the base of the transistor to produce a current flow at the collector thereof that is equal to beta times the base current. The total current flowing into the circuit node to which the collector and capacitor are interconnected is equal to a value of a sum of the two currents. Thus, the effective capacitance value seen at the circuit node is greater than the capacitance value of the capacitor by a factor of beta.

There are many applications for electronically tunable reactance circuits. For instance, frequency modulator (FM) systems often use a crystal controlled oscillator circuit that includes a variable capacitance for frequency modulation. For example, one prior art technique that has been used is to provide a variable capacitance diode in combination with the aforementioned oscillator to provde direct frequency modulation. However, it is difficult or impossible to realize a variable capacitance diode in an integrated circuit such that the prior art is not useful for integrated frequency modulation schemes. Instead, some prior art integrated circuits such as the MC1376, manufactured by Motorola, Inc., have provided frequency modulation by changing the feedback phase of the oscillator instead of using a variable capacitance diode.

Therefore, if the effective capacitance of the above described capacitance multiplier circuit could be varied over a predetermined range such a circuit could be utilized in an integrated circuit for frequency modulation.

Thus, a need exists for a capacitance multiplier circuit of which the capacitive reactance can be electronically varied over a predetermined range of values and which is suited to be manufactured in integrated circuit form.

SUMMARY OF THE INVENTION

Accordingly, it is an object of the present invention to provide an improved capacitance multiplier circuit.

It is another object of the present invention to provide an improved variable reactance circuit.

Still another object of the present invention is to provide a variable reactance circuit suited to be manufactured in integrated circuit form, the output reactance of which is electronically varied.

A further object of the present invention is to provide a variable reactance circuit for use in a frequency modulator system.

In accordance with the above and other objects there is provided a variable reactance circuit in which the output capacitance is made variable and that comprises a transistor the emitter of which is AC coupled to ground and the collector coupled to the output of the circuit, a capacitor coupled between the base and collector of the transistor, a variable impedance AC coupled between the base and emitter of the transistor, and control circuitry responsive to an applied input signal for causing the emitter current of the transistor and the impedance of the variable impedance to be varied in direct relationship such that the output capacitance value of the variable reactance circuit is varied accordingly.

DETAILED DESCRIPTION OF THE PREFERRED EMBODIMENTS

Figure 1:
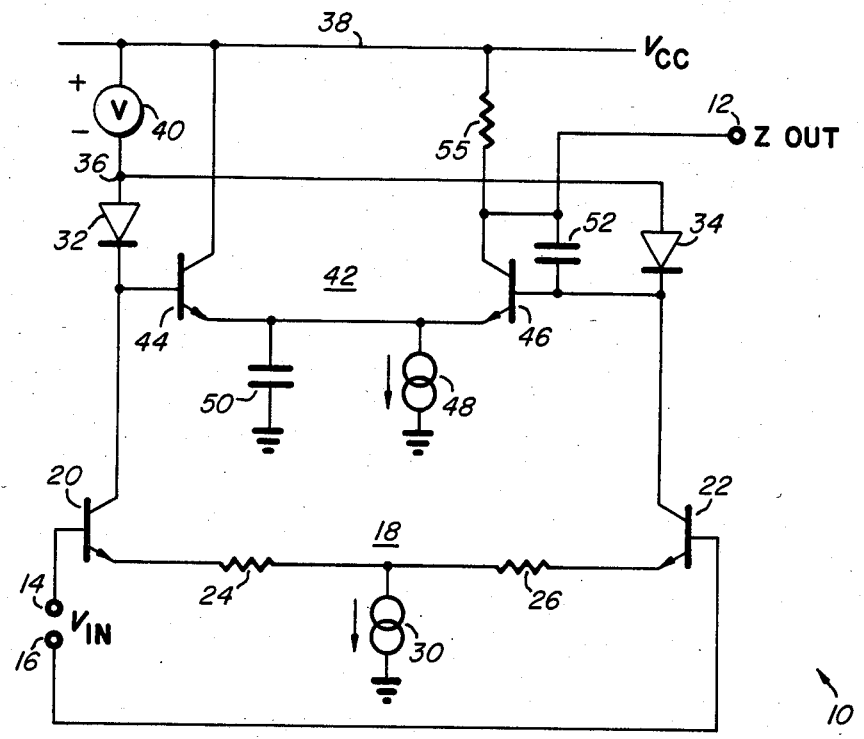
FIG. 1 is a schematic diagram illustrating the variable reactance circuit of the preferred embodiment.

Turning to FIG. 1 there is illustrated a variable reactance circuit 10 of the present invention. The variable reactance circuit 10 is suitable to be manufactured in monolithic integrated circuit form and includes an output 12 and a pair of inputs 14 and 16. As will be described in detail later, the output capacitive reactance value of output impedance, ZOUT, can be electronically varied over a predetermined range of values in response to a input signal Vin being applied at inputs 14 and 16. Inputs 14 and 16 are coupled to first and second inputs of differential amplifier 18 which comprises NPN transistors 20 and 22. The base electrodes of transistors 20 and 22 are illustrated as being connected respectively to inputs 14 and 16 with the emitters interconnected via resistors 24 and 26 to a common node to current source 30. The collectors of transistors 20 and 22 correspond to first and second outputs of differential amplifier 18. Current load means is provided to the collectors of transistors 20 and 22 by diodes 32 and 34 which are connected between the outputs of differential amplifier 18 to power supply conductor 38 via a voltage offsetting means 40. A source of operating potential VCC is supplied to power supply conductor 38. It is understood that the voltage offset means 40 can be realized by use of a battery or even a diode interconnected between power supply conductor 38 and node 36 to the anodes of diodes 32 and 34.

A second differential amplifier 42 including a pair of transistors 44 and 46 act as a load stage to differential amplifier 18. The base electrodes of transistors 44 and 46 are coupled respectively to the collectors of transistors 20 and 22. The emitters of transistors 44 and 46 are interconnected to current source 48 and are AC coupled to ground through capacitor 50. The collector of transistor 44 is returned directly to power supply conductor 38 while the collector of transistor 46 is returned to the latter via load resistor 55. It should also be understood that the collector of transistor 44 could be returned to power supply conductor 38 through an appropriate resistance. A capacitor 52 (which has a nominal capacitance value) is coupled between the base and collector of transistor 46 to output 12.

The principle of operation of variable reactance circuit 10 is similar to the capacitance multiplier circuit disclosed in the referenced '296 Patent in that transistor 46 of differential amplifier 42 is AC connected as a common emitter amplifier and includes capacitor 52 coupled between the collector and base thereof. Thus, an effective output capacitance at output 12 is proportional to the capacitance value of capacitor 52. As the value of input signal Vin is varied, differential amplifier 18 and transistor 44 function in conjunction as control circuitry to cause the conduction of transistor 46 and diode 34 to vary inversely whereby the impedance of the latter varies in direct relationship to the emitter current of the former. Therefore, as the current flowing through diode 34 is reduced, its impedance increases in response to Vin in direct relation to the emitter current of transistor 46 causing the effective output capacitance at output 12 to vary over a predetermined range of values from a minimum value, equal to the capacitance of capacitor 52, to a maximum value that is proportional to the emitter current of transistor 46, the beta of transistor 46 and the value of capacitor 52.

Figure 2:
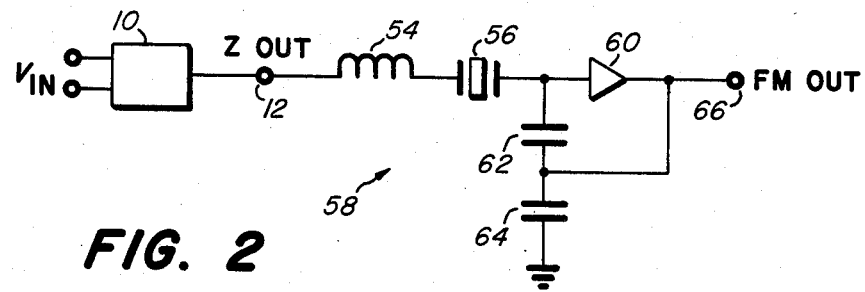
FIG. 2 is a partial block and schematic diagram of a frequency modulator system including the variable reactance circuit of FIG. 1.

Variable reactance circuit 10 of the present invention can be utilized in a frequency modulator (FM) system as illustrated in FIG. 2 wherein direct frequency modulation of an oscillator signal is produced. In the FM system of FIG. 2 the output of variable reactance circuit 10 is coupled with the tank circuit comprising inductor 54, and crystal 56 of oscillator 58. Oscillator 58 includes amplifier 60 and feedback to capacitor 62 and 64 such that as the reactance of variable reactance circuit 10 is varied in response to Vin a frequency modulated output signal is produced at output 66.

Thus, what has been described above is a novel variable reactance circuit comprising two sets of differential amplifiers with the second corresponding to the load of the first wherein one transistor of the second differential amplifier functions as a capacitance multiplier circuit in combination with a capacitor connected between the collector and base thereof. A diode provides a variable impedance AC coupled between the base of the transistor (which is connected to one output of the first differential amplifier) and its emitter such that the impedance thereof varies in direct relationship as the conduction of the transistor in response to a signal applied to the first differential amplifier. This causes the effective output capacitive reactance at of the variable reactance circuit to be varied accordingly.

We claim:

1. A variable reactance circuit having a pair of inputs and an output, comprising:
    a first transistor having an emitter, collector and base electrodes, said collector electrode being coupled to the output of the circuit;
    capacitive means coupled between said base and said collector electrodes of said first transistor, said capacitive means having a nominal capacitance value;
    variable impedance means AC coupled between said base and said emitter electrodes of said first transistor; and
    control circuit means responsive to an applied signal for causing the emitter current of said first transistor and said impedance of said variable impedance means to be varied in direct relationship wherein the output capacitance of the variable reactance circuit is varied accordingly.

2. A variable reactance circuit having a pair of inputs and an output, comprising:
    a first transistor having an emitter, collector and base electrodes, said collector electrode being coupled to the output of the circuit;
    capacitive means coupled between said base and said collector electrodes of said first transistor, said capactive means having a nominal capacitance value;
    variable impedance means AC coupled between said base and said emitter electrodes of said first transistor; and
    control circuit means responsive to an applied signal for causing the emitter current of said first transistor and said impedance of said variable impedance means to be varied in direct relationship wherein the output capacitance of the variable reactance circuit is varied accordingly, said control circuit including:
    a. a second transistor having emitter, collector and base electrodes, said emitter elecrode being coupled to said emitter electrode of said first transistor, said collector electrode being coupled with said collector electrode of said first transistor to a source of operating potential;
    b. a current source interconnected to said emitter electrodes of said first and second transistors; and
    c. differential amplifier means having first and second inputs and first and second outputs, said first and second inputs being adapted to receive said applied signal for producing differential output currents at said first and second outputs, said first and second outputs being coupled respectively to said base electrodes of said second and first transistors.

3. The variable reactance circuit of claim 2 wherein said impedance means is a first diode having an anode and cathode, said anode being coupled to said source of operating potential and said cathode being coupled to said second output of said differential amplifier.

4. The variable reactance circuit of claim 3 including a second diode having an anode and cathode, said anode being coupled to said anode of said first diode, said cathode being coupled to said first output of said differential amplifier.

5. The variable reactance circuit of claim 4 wherein said differential amplifier includes:
    first and second transistors each having emitter, collector and base electrodes, said base electrodes being said first and second inputs respectively, said collector electrodes being coupled to said first and second outputs respectively and said emitter electrodes being interconnected; and
    a constant current source connected to said emitter electrode of said first and second transistors of said differential amplifier.

6. The variable reactance circuit of claim 2 including additional capacitor means coupled between said emitter electrode of said first transistor and a ground reference for providing AC coupling therebetween.

7. An integrated variable reactance circuit having first and second inputs and an output, comprising:
    first and second power supply conductors adapted to receive respectively an output potential and ground potential;
    first differential amplifier means having first and second inputs and first and second outputs, said first and second inputs being coupled respectively to the first and second inputs of the integrated variable reactance circuit at which is supplied a variable input control signal;

current load means for coupling said first and second outputs of said first differential amplifier means to said first power supply conductor;

second differential amplifier means having first and second inputs and an output, said first and second inputs being coupled to said first and second outputs of said first differential amplifier means, said output being coupled to the output of the integrated variable reactance circuit;

capacitance means coupled between said second input of said second differential amplifier means and said output of said second differential amplifier means; and said current load means including variable impedance means AC coupled between said second input of said second differential amplifier means and said second power supply conductor, the impedance of said variable impedance means being varied in response to said input control signal being varied.

8. The integrated variable reactance circuit of claim 7 wherein said second differential amplifier means includes:

a first transistor having base, emitter and collector electrodes, said base electrode being said first input of said second differential amplifier means, said emitter electrode being AC coupled to said second power supply conductor, said collector electrode being connected to said first power supply conductor;

a second transistor having base, emitter and collector electrodes, said base electrode being said second input of said second differential amplifier means, said emitter electrode being AC coupled to said second power supply conductor, said collector electrode being coupled both to said first power supply conductor and said output of said second differential amplifier means; and current source means coupled between said emitter electrode of said first and second transistor and said second power supply conductor.

9. The integrated variable reactance circuit of claim 8 wherein said variable impedance means is a diode, the impedance of said diode being varied in direct relationship to the current flowing in said emitter of said second transistor of said second differential amplifier means in response to the input control signal being varied to thereby vary the output capacitance value of the integrated variable reactance circuit over a predetermined range of values.

10. In a frequency modulation system including a crystal controlled oscillator, a reactive tank circuit formed by a variable capacitance and an inductor in which the capacitance value is varied to vary the frequency of the output oscillatory signal from the oscillator, the improvement including the variable capacitance comprising:

first and second power supply conductors adapted to receive an operating potential and ground potential respectively;

a first differential amplifier having first and second inputs and first and second outputs, said first and second inputs being adapted to receive an input control signal;

current load means for coupling said first and second outputs of said first differential amplifier to said first power supply conductor;

a second differential amplifier having first and second inputs and an output, said first and second inputs being coupled to said first and second outputs of said first differential amplifier, said output being coupled to the inductor of the reactive tank;

capacitive means coupled between said second input of said second differential amplifier and said output of said second differential amplifier; and said current load means including variable impedance means AC coupled between said second input of said second differential amplifier and said second power supply conductor, the impedance of said variable impedance means being varied in response to the magnitude of said input control signal being varied.

11. The frequency modulation system of claim 10 wherein said second differential amplifier includes:

a first transistor having base, emitter and collector electrodes, said base electrode being said first input of the second differential amplifier, said emitter electrode being AC coupled to said second power supply conductor, said collector electrode being connected to said first power supply conductor; and a second transistor having base, emitter and collector electrodes, said base electrode being said second input of said second differential amplifier, said emitter electrode being AC coupled to said second power supply conductor, said collector electrode being coupled to said first power supply conductor; and current source means coupled between said emitter electrodes of said first and second transistor and said second power supply conductor.

12. The frequency modulation system of claim 11 wherein said variable impedance means is a diode the impedance of which is varied in direct relationship to the current flowing in said emitter electrode of said second transistor in response to the input control signal being varied so as to vary the effective output capacitance of the variable reactance circuit over a predetermined range of values.

* * * * *